(12) United States Patent
Ouellette

(10) Patent No.: US 6,388,435 B1
(45) Date of Patent: May 14, 2002

(54) METHODS AND APPARATUS FOR VOLTAGE MEASUREMENT

(75) Inventor: Maurice J. Ouellette, North Berwick, ME (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/471,052

(22) Filed: Dec. 22, 1999

Related U.S. Application Data
(60) Provisional application No. 60/114,449, filed on Dec. 31, 1998.

(51) Int. Cl.$^7$ .......................... G01R 21/06; G01R 13/02
(52) U.S. Cl. ...................................... 324/142; 324/140 R
(58) Field of Search ................................. 324/142, 107, 324/141, 111, 120, 140 R

(56) References Cited

U.S. PATENT DOCUMENTS

| | | | | |
|---|---|---|---|---|
| 3,976,987 A | * | 8/1976 | Anger | 340/255 |
| 4,293,813 A | * | 10/1981 | Groenenboom | 324/117 R |
| 4,378,524 A | * | 3/1983 | Steinmuller | 324/107 |
| 4,594,634 A | * | 6/1986 | Schminke | 361/93 |
| 4,811,236 A | * | 3/1989 | Brennen et al. | 702/64 |
| 5,128,611 A | * | 7/1992 | Konrad | 324/142 |
| 5,450,328 A | * | 9/1995 | Janke et al. | 324/522 X |
| 5,710,778 A | | 1/1998 | Bettman et al. | |
| 5,774,291 A | | 6/1998 | Contreras et al. | |
| 5,798,933 A | | 8/1998 | Nicolaï | |
| 5,834,973 A | | 11/1998 | Klatser et al. | |
| 5,920,188 A | | 7/1999 | Voorheis et al. | |
| 6,184,725 B1 | | 2/2001 | Mohr | |
| 6,191,676 B1 | * | 2/2001 | Gabor | 336/160 |
| 6,194,910 B1 | | 2/2001 | Davis et al. | |
| 6,239,586 B1 | | 5/2001 | Fawcett et al. | |
| 6,243,652 B1 | | 6/2001 | Fawcett et al. | |

* cited by examiner

*Primary Examiner*—N. Le
*Assistant Examiner*—T. R. Sundaram
(74) *Attorney, Agent, or Firm*—Karl Vick, Esq.; Damian Wasserbauer, Esq.; Armstrong Teasdale LLP

(57) ABSTRACT

A method is described for measuring a plurality of line voltages using a measurement circuit, the method including the steps of reducing each line voltage over a first impedance; providing a second impedance between each of the reduced voltages and a measurement circuit common reference point; coupling the common reference point to a voltage line N using a third impedance; and determining line voltage values using measurements of the reduced voltages. The above-described method provides impedance between voltage line N and measurement electronics and thus prevents transient voltages from entering the measurement circuit.

20 Claims, 2 Drawing Sheets

METHODS AND APPARATUS FOR VOLTAGE MEASUREMENT

CROSS-REFERENCE TO RELATED APPLICATIONS

This application claims the benefit of U.S. provisional application No. 60/114,449, filed Dec. 31, 1998.

BACKGROUND OF THE INVENTION

This invention relates generally to making voltage measurements, and more particularly, to measuring voltages on a distribution line coupled to an electricity meter.

A watt-hour electricity meter typically measures several current and voltage inputs. DC isolation and an impedance are often provided to scale the currents down to appropriate levels for electronic measurement. Voltage inputs, however, are most economically measured by a simple resistor divider to neutral circuit (or some other voltage line if the service type has no neutral). The neutral is one of the AC distribution lines and is connected directly into the measurement electronics of the meter. This connection to the neutral line provides a direct low impedance path for transients from the AC lines to enter the meter electronics and disrupt operation or even damage the circuits.

Some known meters have voltage transformers in the voltage measurement circuit. These transformers perform multiple functions including scaling the voltage down to a level appropriate for measurement by an electronic circuit, and providing both DC isolation and some level of impedance to transients entering the meter electronics from the distribution lines. The transformers, however, are costly and heavy, failure prone, introduce measurement errors, consume significant power, and require a large amount of space in the meter.

Other known meters include resistors to scale the voltage down to a level appropriate for measurement by an electronic circuit. The resistors avoid some of the error types present in transformers. The resistors are also lower in cost, weight, power consumed, and size. The resistor method, however, provides no DC isolation or impedance between the neutral and the measurement electronics.

BRIEF SUMMARY OF THE INVENTION

There is therefore provided, in one embodiment, a method for measuring a plurality of line voltages using a measurement circuit, the method including the steps of reducing each line voltage over a first impedance; providing a second impedance between each of the reduced voltages and a measurement circuit common reference point; coupling the common reference point to a voltage line N using a third impedance; and determining line voltage values using measurements of the reduced voltages. The above-described method provides impedance between voltage line N and measurement electronics and thus prevents transient voltages from entering the measurement circuit.

DETAILED DESCRIPTION OF THE INVENTION

Although the present invention is described herein in the context of an electricity meter, it should be understood that the invention is not limited to practice in connection with such meters. The present invention can be used in connection with voltage measurement apparatus generally, and is not limited to practice in only electricity metering.

Figure 1:
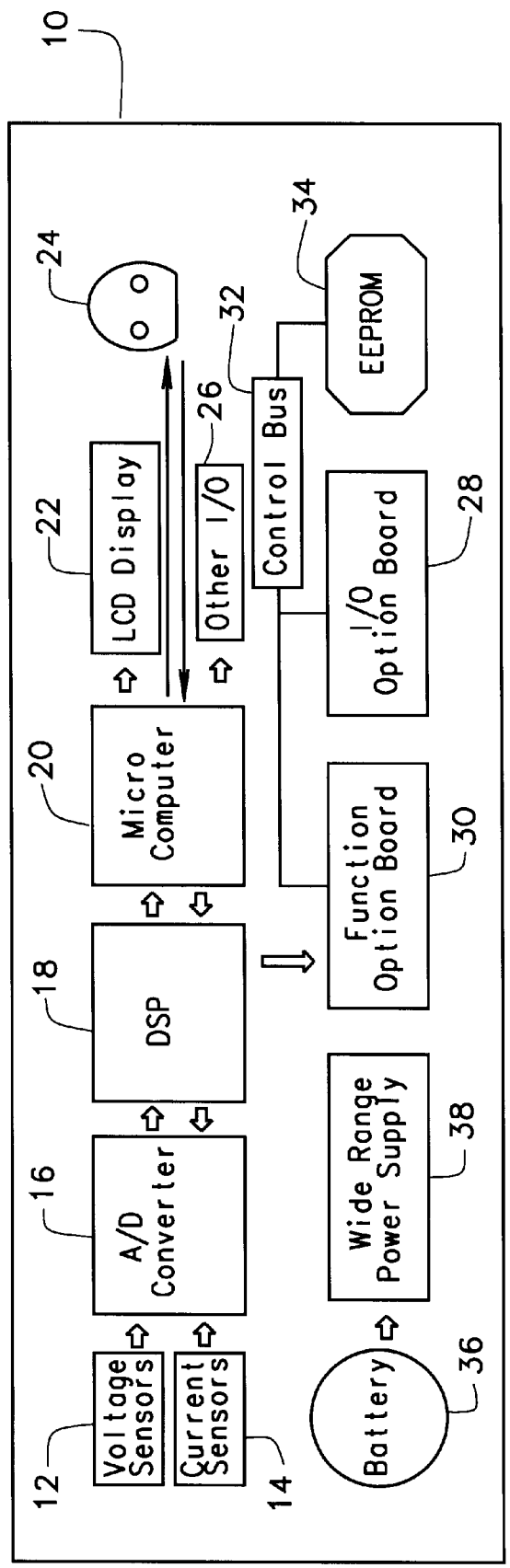
FIG. 1 of an electronic energy meter.

Referring now to the drawings, FIG. 1 is a block diagram illustration of an exemplary electronic energy meter 10 which, for example, is commercially available from General Electric Company, 130 Main Street, Somersworth, N.H. 03878, and generally referred to as the KV meter. The KV meter can be modified to incorporate the voltage measurement circuit described below in more detail. Although the present apparatus and methods are described herein in the context of an electronic electricity meter, it should be understood that the present invention is not limited to practice with any one particular meter.

Referring now specifically to FIG. 1, meter 10 includes voltage sensors 12 and current sensors 14. Sensors 12 and 14, in operation, typically receive input analog voltage and current signals from power lines (not shown). Sensors 12 and 14 are coupled to an analog-to-digital (A/D) converter 16 which converts the input analog voltage and current signals to digital signals. Digital signal output of converter 16 is provided to a digital signal processor (DSP) 18. DSP 18 supplies microcomputer or processor 20 with digitized metering quantities, e.g., $V^2H$, $I^2H$. Microcomputer 20, using metering quantities supplied by DSP 18, performs additional metering calculations and functions. DSP 18 may, for example, be a processor commercially available as Model Number TMS320 from Texas Instruments Company, P.O. Box 6102, Mail Station 3244, Temple, Tex. 76503, modified to perform metering functions.

Microcomputer 20 is coupled to a liquid crystal display (LCD) 22 to control display of various selected metering quantities and to an optical communications port 24 to enable, for example, an external reader to communicate with computer 20. Port 24 may be, e.g., an OPTOCOM™ port of General Electric Company, 130 Main Street, Somersworth, N.H. 03878, which is well known and in accordance with ANSI type II optical port specifications. Microcomputer 20 may also generate additional outputs 26 used for various other functions as is well known in the art. Microcomputer 20 may, for example, be an eight-bit microcomputer commercially available from Hitachi America, Inc., Semiconductor & I.C. Division, Hitachi Plaza, 2000 Sierra Point Parkway, Brisbane, Calif. 94005-1819, modified to perform metering functions.

Microcomputer 20 also is coupled to an input/output (I/O) board 28 and to a function, or high-function, board 30. DSP 18 also supplies outputs directly to high function board 30. Microcomputer 20 further is coupled, via a control bus 32, to an electronically erasable programmable read-only memory (EEPROM) 34, I/O board 28 and high function board 30 also are coupled, via bus 32, to EEPROM 34.

Back-up power is supplied to meter 10 components described above by a battery 36 coupled to a wide-range power supply 38. In normal operation when no back-up power is required, power is supplied to meter 10 components from power lines (not shown) via power supply 38.

Many functions and modifications of meter 10 components described above are well understood in the metering art. The present application is not directed to such understood and known functions and modifications. Rather, the present application is directed to methods and apparatus for making voltage measurements. In addition, although methods and apparatus are described below in the hardware environment shown in connection with FIG. 1, it should be understood that such methods and apparatus are not limited to practice in such environment. The subject methods and apparatus could be practiced in many other environments.

Further, it should be understood that the present invention can be practiced with many alternative microcomputers, and is not limited to practice in connection with just microcomputer 20. Therefore, and as used herein, the term microcomputer is not limited to mean just those integrated circuits referred to in the art as microcomputers, but broadly refers to microcomputers, processors, micro-controllers, application-specific integrated circuits, and other programmable circuits.

In accordance with one embodiment of the present invention, an impedance (not shown in FIG. 1) is coupled into a common measurement circuit voltage point (not shown in FIG. 1), typically neutral, to help prevent transients from entering meter 10. In addition, compensation is made for presence of the impedance in measurement of voltages on AC lines into meter 10.

Figure 2:
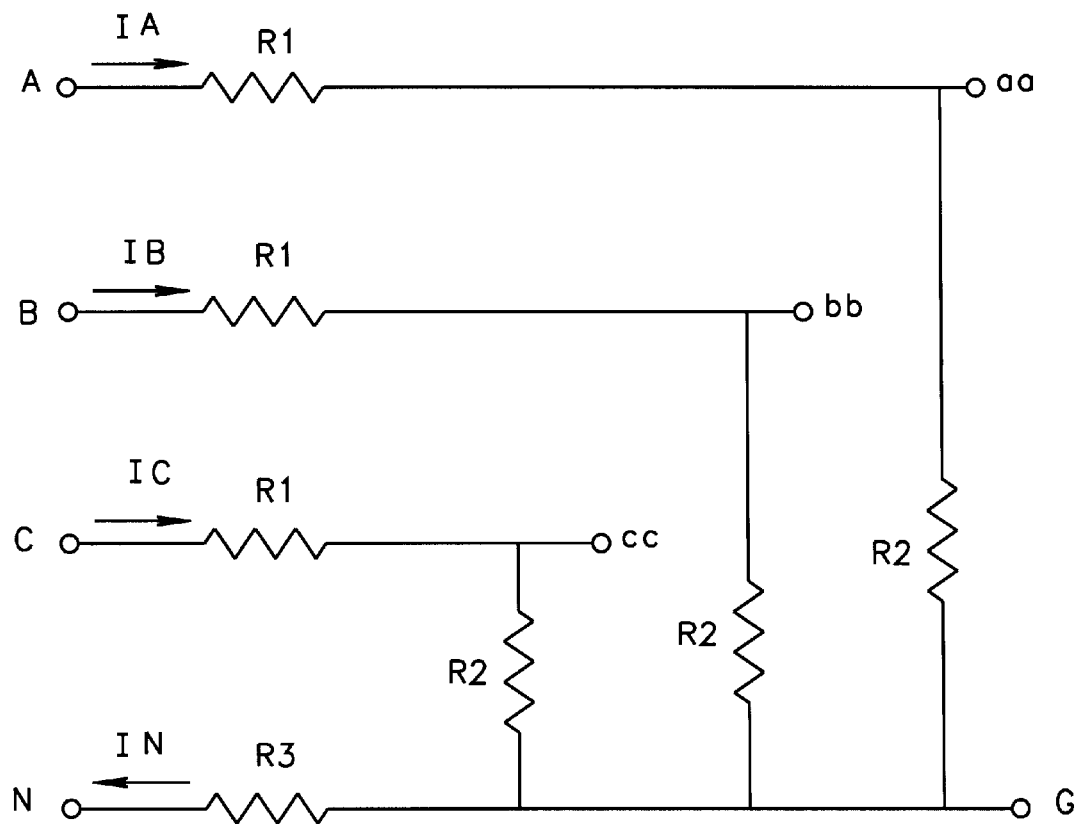
FIG. 2 is a circuit schematic diagram of a voltage measurement circuit in accordance with one embodiment of the present invention.

More particularly, FIG. 2 is a circuit schematic diagram of a voltage measurement circuit, e.g., corresponding to voltage sensor 12 shown in FIG. 1. Referring to FIG. 2, points A, B, C, and N represent attachment points of meter 10, for example, to three lines A, B and C of a three-phase AC voltage line and to a neutral line N respectively. Line N, however, is not necessarily neutral and may be another line voltage, including one of phase voltage lines A, B and C. Line currents IA, IB, IC and IN flow respectively through lines A, B, C and N. Point G represents a ground or common point or reference for measurements in meter 10.

Points aa, bb, and cc represent points of connection to meter 10 measurement circuit and are separated respectively from points A, B and C by very big impedances R1. "Very big impedances" means impedances of, for example, 1 million to 2 million ohms that reduce power into meter 10 in accordance with $P=V^2/R$. Meter 10 measurement circuit load currents at points aa, bb, and cc thus are very small. Impedances R2 couple points aa, bb and cc respectively to point G. Impedances R1 and R2 together reduce voltages, in accordance with ratio R2/(R1+R2), respectively at points aa, bb, and cc to levels measurable by meter 10, for example, to one volt. In one embodiment, an impedance R3 couples neutral line N and point G. There is no return path from point G to neutral line N or to lines A, B or C, and thus no line current flows into G from meter 10 measurement circuit.

In accordance with the configuration shown in FIG. 2, line currents are summed in accordance with IA+IB+IC=IN. Current IN also is determined in terms of measured quantities, e.g.

$$IN=VaaG/R2+VbbG/R2+VccG/R2$$

where VaaG, VbbG and VccG represent respectively voltages between points aa, bb and cc and point G. Voltage VGN from point G to point N is determined in accordance with VGN=IN*R3. Voltage sums then are determined in accordance with:

$$VAN=VAG+VGN$$
$$VBN=VBG+VGN$$
$$VCN=VCG+VGN$$

where VAN, VBN and VCN represent respective voltages between points A, B and C and point N and VAG, VBG and VCG represent respective voltages between points A, B and C and point G. Measured phase voltages at points aa, bb and cc respectively are related to VAG, VBG and VCG in accordance with:

$$VaaG=VAG*(R2/R1+R2)$$
$$VbbG=VBG*(R2/R1+R2)$$
$$VccG=VCG*(R2/R1+R2)$$

Voltages VAN, VBN, and VCN then are determined in accordance with:

$$VAN=VaaG*(R1+R2)/R2+(R3/R2)*(VaaG+VbbG+VccG)$$
$$VBN=VbbG*(R2+R2)/R2+(R3/R2)*(VaaG+VbbG+VccG)$$
$$VCN=VccG*(R1+R2)/R2+(R3/R2)*(VaaG+VbbG+VccG)$$

The foregoing equations are executed by DSP 18 or microcomputer 20 to determine voltages VAN, VBN, VCN from measurable quantities with impedance R3 in place. In one embodiment impedance R3 is selected to be small relative to impedance R1 and to contribute minimally to meter 10 total measurement. A value for impedance R3 is, for example, ten thousand ohms, and an exemplary range of values from which to select impedance R3 is between one thousand and ten thousand ohms. Also, although impedances R2 are identically designated herein, it is not necessary to select identical values for impedances R2. An exemplary range of values from which to select impedances R2 is between one hundred ohms and one thousand ohms. Thus impedance R2 is, for example, selected to be 348 ohms.

The above-described voltage measurement circuit provides impedance between neutral line N and measurement electronics. By using resistors to scale voltages to a level appropriate for measurement, the above-described measurement circuit provides advantages as to cost, weight, power consumption, and size.

While the invention has been described in terms of various specific embodiments, those skilled in the art will recognize that the invention can be practiced with modification within the spirit and scope of the claims.

What is claimed is:

1. A method for measuring a plurality of line voltages using a measurement circuit, said method comprising the steps of:
   reducing each line voltage over a corresponding first impedance;
   providing a second impedance between each of the reduced voltages and a measurement circuit common reference point;
   providing a third impedance configured to facilitate preventing transient currents within a voltage line;
   coupling the common reference point to the voltage line using the third impedance; and
   determining line voltage values using measurements of the reduced voltages.

2. A method in accordance with claim 1 wherein said step of determining line voltage values using measurements of the reduced voltages further comprises the step of using a value for the third impedance.

3. A method in accordance with claim 1 wherein the impedances are resistors.

4. A method in claim 1 wherein the voltage line is a neutral line.

5. A method in accordance with claim 1 wherein said step of determining line voltage values using measurements of the reduced voltages comprises the step of measuring the reduced voltages between the corresponding first and second impedances.

6. A method in accordance with claim 5 wherein said step of determining line voltage values using measurements of the reduced voltages comprises the step of determining a current IN connecting to the voltage line in accordance with:

$$IN=VaaG/R2+VbbG/R2+VccG/R2$$

where VaaG, VbbG and VccG respectively represent the reduced voltage measurements and R2 represents at least one second impedance value.

7. A method in accordance with claim 6 further comprising the step of determining line voltage values VAN, VBN and VCN in accordance with:

$$VAN=VAG+VGN$$

$$VBN=VBG+VGN$$

$$VCN=VCG+VGN$$

where VAN, VBN and VCN represent respective voltages between the line voltages and the voltage lines, VAG, VBG, and VCG represent respective voltages between the line voltages and the measurement circuit common reference point, and VGN represents a voltage between the measurement circuit common reference point and the voltage line.

8. A method in accordance with claim 7 further comprising the step of relating the line voltage values VAN, VBN and VCN to the reduced voltage measurements VaaG, VbbG and VccG in accordance with:

$$VaaG=VAG*(R2/R1+R2)$$

$$VbbG=VBG*(R2/R1+R2)$$

$$VccG=VCG*(R2/R1+R2)$$

where R1 represents at least one first impedance value.

9. A method in accordance with claim 8 further comprising the step of determining the line voltage values in accordance with:

$$VAN=VaaG*(R1+R2)/R2+(R3/R2)*(VaaG+VbbG+VccG)$$

$$VBN=VbbG*(R1+R2)/R2+(R3/R2)*(VaaG+VbbG+VccG)$$

$$VCN=VccG*(R1+R2)/R2+(R3/R2)*(VaaG+VbbG+VccG)$$

where R3 represents a third impedance value.

10. A method in accordance with claim 1 wherein the third impedance is ten thousand ohms.

11. A method in accordance with claim 1 wherein at least one of the first impedances is one million ohms and at least one of the second impedances is 348 ohms.

12. A voltage measurement circuit for measuring a plurality of line voltages, said measurement circuit comprising:
    a measurement circuit common reference point;
    a first impedance for each line voltage and a reduced voltage measurement point for each line voltage, said first impedance coupling the corresponding line voltage to said corresponding reduced voltage measurement point;
    a second impedance for each line voltage, said second impedance coupling said corresponding reduced voltage measurement point to said measurement circuit common reference point; and
    a third impedance coupling said measurement circuit common reference point to a voltage line, said third impedance configured to facilitate preventing transient currents within said voltage line.

13. A voltage measurement circuit in accordance with claim 12 further comprising a processor configured to determine line voltage values using reduced voltage measurements from said reduced voltage measurement points.

14. A voltage measurement circuit in accordance with claim 13 wherein said processor is further configured to determine line voltage values using a value for said third impedance.

15. A voltage measurement circuit in accordance with claim 12 wherein said impedances are resistors.

16. A voltage measurement circuit in accordance with claim 12 wherein said third impedance couples said measurement circuit common reference point to a neutral line.

17. A voltage measurement circuit in accordance with claim 13 wherein said processor configured to determine line voltage values VAN, VBN and VCN, using reduced voltage measurements from said reduced voltage measurement points, in accordance with:

$$VAN=VAG+VGN$$

$$VBN=VBG+VGN$$

$$VCN=VCG+VGN$$

where VAG, VBG and VCG represent respective voltages between the line voltages and said measurement circuit common reference point and VGN represents a voltage between said measurement circuit common reference point and the voltage line.

18. A voltage measurement circuit in accordance with claim 13 wherein said processor being configured to determine line voltage values using reduced voltage measurements from said reduced voltage measurement points comprises said processor being configured to determine line voltage values VAN, VBN and VCN in accordance with:

$$VAN=VaaG*(R1+R2)/R2+(R3/R2)*(VaaG+VbbG+VccG)$$

$$VBN=VbbG*(R1+R2)/R2+(R3/R2)*(VaaG+VbbG+VccG)$$

$$VCN=VccG*(R1+R2)/R2+(R3/R2)*(VaaG+VbbG+VccG)$$

where R1 represents at least one value for said first impedances, R2 represents at least one value for said second impedances, R3 represents a value for said third impedance and VaaG, VbbG and VccG respectively represent the reduced voltage measurements.

19. A voltage measurement circuit in accordance with claim 18 wherein said processor being configured to determine line voltage values VAN, VBN and VCN comprises said processor being configured to relate the line voltage values VAN, VBN and VCN to the reduced voltage measurements VaaG, VbbG and VccG in accordance with:

$$VaaG=VAG*(R2/R1+R2)$$

$$VbbG=VBG*(R2/R1+R2)$$

$$VccG=VCG*(R2/R1+R2).$$

20. A voltage measurement circuit in accordance with claim 19 wherein said processor being configured to relate the line voltage values VAN, VBN and VCN to the reduced voltage measurements VaaG, VbbG and VccG comprises said processor being configured to determine a current IN connecting to the voltage line in accordance with:

$$IN=VaaG/R2+VbbG/R2+VccG/R2.$$

* * * * *

UNITED STATES PATENT AND TRADEMARK OFFICE
CERTIFICATE OF CORRECTION

PATENT NO. : 6,388,435 B1
DATED : May 14, 2002
INVENTOR(S) : Maurice J. Ouellette It is certified that error appears in the above-identified patent and that said Letters Patent is hereby corrected as shown below:

Column 4,
Line 57, delete "A method in claim 1" and insert therefor -- A method in accordance with claim 1 --.

Signed and Sealed this

Twenty-seventh Day of May, 2003

JAMES E. ROGAN
*Director of the United States Patent and Trademark Office*